United States Patent [19]
Guha et al.

[11] Patent Number: 5,298,086
[45] Date of Patent: Mar. 29, 1994

[54] METHOD FOR THE MANUFACTURE OF IMPROVED EFFICIENCY TANDEM PHOTOVOLTAIC DEVICE AND DEVICE MANUFACTURED THEREBY

[75] Inventors: Subhendu Guha; Chi C. Yang, both of Troy, Mich.

[73] Assignee: United Solar Systems Corporation, Troy, Mich.

[21] Appl. No.: 990,085

[22] Filed: Dec. 14, 1992

Related U.S. Application Data

[63] Continuation-in-part of Ser. No. 884,372, May 15, 1992, abandoned.

[51] Int. Cl.$^5$ ................... H01L 31/075; H01L 31/18
[52] U.S. Cl. ................... 136/249; 257/458; 437/2; 437/4
[58] Field of Search ..................... 437/2–5; 136/249 TJ, 258 AM; 257/458, 464

[56] References Cited

U.S. PATENT DOCUMENTS

| | | | |
|---|---|---|---|
| 4,226,898 | 10/1980 | Ovshinsky et al. | 427/83 |
| 4,480,585 | 11/1984 | Gattuso | 118/719 |
| 4,517,223 | 5/1985 | Ovshinsky et al. | 427/875 |
| 4,878,097 | 10/1989 | Yamazaki | 257/55 |
| 5,034,333 | 7/1991 | Kim | 437/4 |
| 5,047,090 | 9/1991 | Hayashi et al. | 136/249 |
| 5,071,490 | 12/1991 | Yokota et al. | 136/249 |
| 5,204,272 | 4/1993 | Guha et al. | 437/4 |

*Primary Examiner*—Aaron Weisstuch
*Attorney, Agent, or Firm*—Howard & Howard

[57] ABSTRACT

The thicknesses of the intrinsic layers of the cells comprising a tandem photovoltaic device are selected so that the cell having the highest quality semiconductor material produces the lowest photocurrent. That cell will then be the dominant cell in the tandem device and its material properties will contribute disproportionately to the overall properties of the tandem device.

15 Claims, 1 Drawing Sheet

5,298,086

METHOD FOR THE MANUFACTURE OF IMPROVED EFFICIENCY TANDEM PHOTOVOLTAIC DEVICE AND DEVICE MANUFACTURED THEREBY

RELATED PATENT

This is a continuation-in-part of application Ser. No. 884,372, filed May 15, 1992 (now abandoned) and entitled "Hybrid Microwave/Radio Frequency Deposition Process and Apparatus."

FIELD OF THE INVENTION

This invention relates generally to photovoltaic devices. More specifically, the invention relates to tandem photovoltaic devices. Most specifically the invention relates to a method for improving the photo conversion efficiency of tandem photovoltaic devices and to devices made by that method.

BACKGROUND OF THE INVENTION

Photovoltaic devices directly convert absorbed illumination to electrical energy. They are silent in operation and non-polluting and they are becoming an increasingly more important source of electric power. Tandem photovoltaic devices comprise a plurality of individual cells disposed on a common substrate in an optical and electrical series relationship. Light passes in sequence through the stacked cells and the voltages produced thereby are additive.

Tandem devices are generally more efficient than single cell devices since the thickness of the individual cells can be optimized to provide the highest operating efficiency and the use of a stacked array increases the utilization of all of the incident light. In some instances the band gaps of the active layers of the cells of the tandem device are varied so as to cause the upper-most device to absorb the short wavelengths of light and the lower cell to absorb the unabsorbed longer wavelengths of light. In this manner a relatively large portion of the solar spectrum may be usefully addressed.

Efficiency is a most important factor in any photovoltaic device and efficiency may be categorized as "operational" and "manufacturing." Operational efficiency is determined by the percent of incident light energy which a photovoltaic device converts to electricity. Obviously, efficiency should be as high as possible in order to minimize the area of a photovoltaic device needed to generate a given amount of power. Manufacturing efficiency is measured by the cost incurred in manufacturing the devices. Clearly, the two parameters interact. A high efficiency, very high cost device may be of lesser commercial importance than a low cost device of more modest efficiency.

Operational efficiency depends on both the quality of the photovoltaic material as well as the device configuration. Material quality is a measure of the density of defect states in a semiconductor material; material quality equates with the density of states in the band gap of the material. Material quality is difficult to measure directly, but it is readily correlatable with the performance of a device incorporating the material. Most photovoltaic devices undergo some degree of photodegradation in use which decreases their efficiency. The amount of photodegradation will vary, and it has been found that the quality of the material comprising the device will determine both the initial device efficiency as well as the likelihood that the device will degrade in use. Material quality has been found to be dependent, in at least part, upon preparation conditions. In the instance of thin film alloy materials such as glow discharge prepared Group IVA materials, deposition parameters such as power levels, gas pressures and deposition rate have been correlated with material quality. Configuration of the photovoltaic device is also determinative of operational efficiency. As noted above, tandem arrays of cells are frequently employed to produce a high efficiency device and, as will be described in greater detail hereinbelow, it is necessary to control the electrical parameters of the various cells comprising the tandem device so as to optimize current and voltage produced therefrom. Control of these parameters is particularly important when cells having different band gaps are disposed in a single device.

Manufacturing efficiency is strongly tied to the utilization of raw materials and to the speed at which devices are fabricated. In general, it is desirable to have maximum throughput in a manufacturing facility, and in the manufacture of photovoltaic devices this translates into rapid deposition of the component semiconductor layer. It has been found that photovoltaic materials produced at relatively high deposition rates are generally of lower quality than those produced at slower deposition rates; hence, high rates of production often represent a trade-off in device efficiency. To some degree, slow deposition rates can be compensated for by utilizing a larger deposition facility, albeit at increased overhead costs. It will thus be appreciated that in the manufacture of photovoltaic devices a practical balance must often be struck between operational and manufacturing efficiencies, particularly in those instances where high volume, relatively low cost consumer oriented products are being produced. Therefore any method or device configuration which can increase either the operational or manufacturing efficiency of a photovoltaic device without adversely affecting the other parameter will be of significant commercial importance.

The present invention, as will be fully explained hereinbelow, provides a relatively high speed, efficient process for the manufacture of tandem photovoltaic devices having high operational efficiencies. The present invention also has great utility in the manufacture of high volume consumer oriented photovoltaic devices such as those used for power generation. These and other advantages of the invention will be readily apparent from the drawings, discussion and description which follow:

BRIEF DESCRIPTION OF THE INVENTION

There is disclosed herein a method for the manufacture of a tandem photovoltaic device of the type which comprises a stacked array of photovoltaic cells disposed in an optical and electrical series relationship. The device comprises a substrate having a first cell disposed thereupon and a second cell in superposed relationship with the first. Each cell comprises a first layer of substantially intrinsic semiconductor material interposed between a layer of P-doped semiconductor material and a layer of N-doped semiconductor material. The first cell is operative, when it is incorporated in the tandem photovoltaic device and the device is subject to illumination, to generate a first photocurrent in response to the absorption of light thereby. The second cell, when so disposed, is likewise operative to generate a second photocurrent. In accord with the method of the present invention the thickness of the layer of substantially intrinsic semiconductor material of the second cell is selected so that the second photocurrent is less than the first photocurrent; and the first and second intrinsic layers are prepared by deposition processes wherein the material quality of the second layer is greater than the material quality of the first layer.

In a particular embodiment, the first intrinsic layer is deposited by a high rate, microwave energized process and the second intrinsic layer is deposited at a lower rate by a radio frequency energized deposition process. In other instances, the device further includes a third cell interposed between the first and second. The third cell is operative to generate a third photocurrent, and in accord with the invention, the photocurrent of the second cell is less than the photocurrent of the first and third cell. The material quality of the intrinsic layer of the third cell may, in some instances, be intermediate the material quality of the intrinsic layers of the first and second cells. In some instances the intrinsic layers of the individual cells are fabricated from materials having different band gaps.

In accord with the present invention, there is also provided an improved tandem photovoltaic device of the type described herein above, wherein the individual cell which produces the lowest photocurrent is fabricated from the highest quality semiconductor material. In particular embodiments, the cells are fabricated from Group IVA based semiconductor alloy materials.

DETAILED DESCRIPTION OF THE INVENTION

Figure 1:
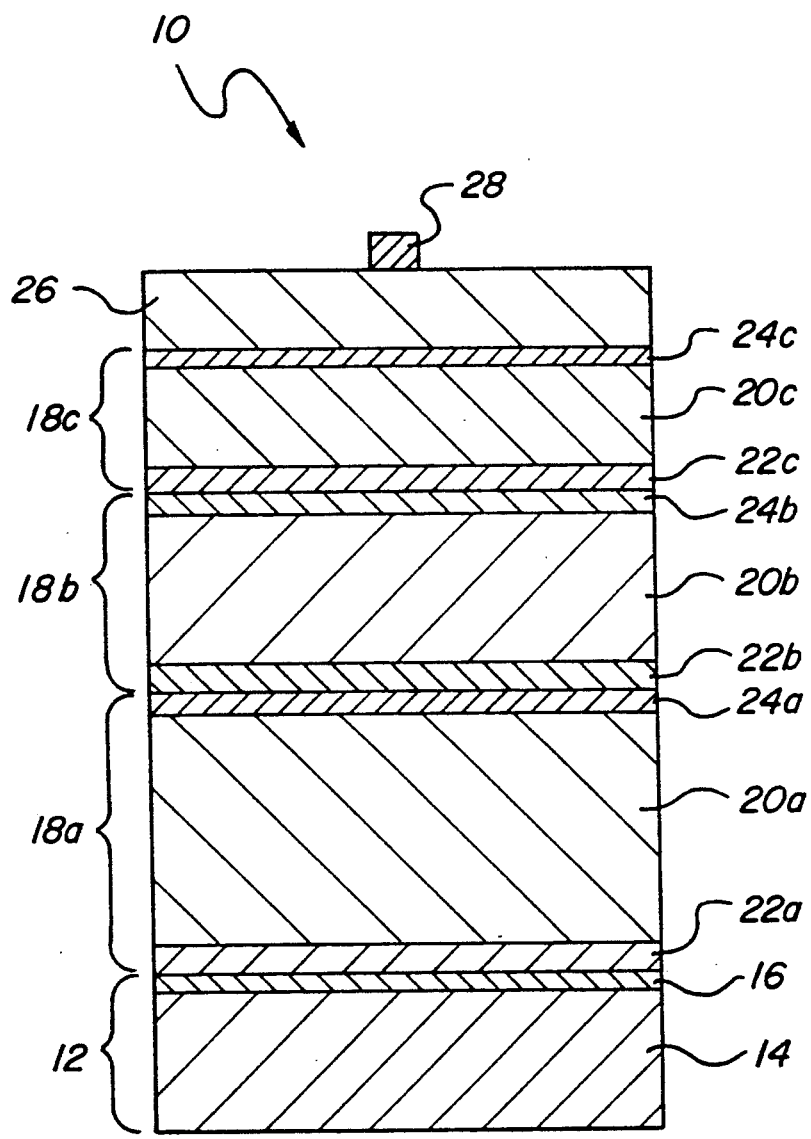
FIG. 1 is a cross-sectional view of a tandem photovoltaic device structured in accord with the principles of the present invention.

Referring now to FIG. 1, there is shown a tandem photovoltaic device 10 of the type which may be used in conjunction with the present invention. The device 10 comprises a stacked array of photovoltaic cells 18a-18c interposed between a substrate electrode 12 and a top electrode 26.

The device 10 is fabricated upon a substrate 12 which supports the overlying semiconductor layers and provides a bottom electrode for the device. The substrate 12 may comprise a body of stainless steel or other such metal or it may comprise an electrically insulating material, such as a polymer, ceramic, or glass, with an electrically conductive coating thereupon. In the illustrated embodiment, the substrate 12 is a composite substrate formed of an electrically conductive, base 14, preferably of stainless steel; having a light reflective coating 16, such as a layer of silver or aluminum thereupon. In this instance, the reflective coating 16 serves to further enhance the efficiency of the photovoltaic device by redirecting any unabsorbed illumination back therethrough. In some instances a layer of an electrically conductive, substantially transparent material such as zinc oxide may be disposed atop the reflective layer 16. As is well known in the art, there exist various configurations of back reflectors for use in photovoltaic devices, all of which may be employed in connection with the present invention. Therefore in the context of this disclosure, the term "substrate" shall include metallic substrates as well as electrically insulating substrates having conductive coatings thereupon, and shall further include any light reflective structures associated with the substrate.

Disposed atop of the substrate 12 is a first photovoltaic cell 18a. This cell is of P-I-N type configuration and includes a body of substantially intrinsic semiconductor material 20a interposed between a layer of P-doped semiconductor material and a layer of N-doped semiconductor material. In the illustrated embodiment, the layer of N-doped material 22a is closest to the substrate and the layer of P-doped material 24a is disposed on the opposite side of the intrinsic body 20a. It is to be understood that the location of the P-doped layer 22a and N-doped layer 24a may be exchanged in some instances. It should also be kept in mind that the layer of intrinsic material 20a is referred to as a layer of "substantially" intrinsic material in view of the fact that such material may have a slight P-doping therein or a slight N-doping therein. As is well known to those of skill in the art, in a P-I-N type photovoltaic device, the absorption of illumination in the intrinsic layer creates electron-hole pairs which are separated by a field resultant from the presence of the doped layers. The separated carriers are collected and contribute to the photocurrent generated by the cell.

A tandem photovoltaic device includes at least two stacked photovoltaic cells; and within the context of this disclosure, the device 10 includes a second photovoltaic cell 18c in superposed relationship with the first cell 18a. The second cell 18c includes a substantially intrinsic body of semiconductor 20c interposed between a layer of N-doped semiconductor material 22c and a layer of P-doped semiconductor material 24c. The tandem device may include further cells interposed between the first cell 18a and second cell 18c; and as illustrated herein, the device 10 includes a third cell 18b which is comprised of a layer of substantially intrinsic semiconductor material 20b interposed between N-doped 22b and P-doped 24b semiconductor layers.

The device 10 further includes a top electrode 26, which in this particular embodiment is a light transmissive electrode fabricated from a transparent conductive oxide (TCO) material such as indium oxide, tin oxide, zinc oxide, and various other such materials, taken either singly or in combination. As is further illustrated in the figure, the device also includes an electrically conductive grid 28 disposed atop the top electrode 26. The grid 28 is fabricated from a high conductivity material such as a metallic paste or foil and operates to collect photo generated current from the top electrode 26 and to carry it to a collection point. In some instances, the tandem photovoltaic device may be fabricated n an inverted configuration wherein the substrate 12 is electrically conductive and transparent and the top electrode 26 is metallic.

In the photovoltaic device 10 of FIG. 1, light passes through the transparent top electrode 26 and is first absorbed by the second cell 18c so as to generate a photocurrent. The unabsorbed light passes through the second cell 18c to the third cell 18b where a portion is absorbed to generate another photocurrent. The remaining light passes through to the first cell 18a where it is absorbed to generate a photocurrent. Any remaining unabsorbed light is redirected by the reflective layer 16 for a second pass back through the stacked cells.

Since light passes in sequence through the devices they are said to be disposed in an optical series arrangement. The cells are also in an electrical series relationship. It will also be noted that the intrinsic layers 20 of the cells 18 vary in thickness. The reason for the thickness variation is to equalize the photocurrent produced by each of the cells 18a, since conventional wisdom has heretofore held that maximum device efficiency is obtained when currents are matched. As light passes through the device 10 it is attenuated, and hence the bottom most intrinsic layer 20a must be thicker than the top most intrinsic layer 20c if equal currents are to be produced in the first 18a and second 18c cells.

As noted above, the various cells 18 of the device 10 may have intrinsic layers 20 which are all of the same band gap or they may have intrinsic layers 20 which differ in band gap. The absorption of light by a semiconductor material is determined by its band gap, and wide gap materials have an optical absorption beginning at higher energies (optical edge) than do materials having a lower band gap. Therefore, in the fabrication of a multi gap tandem device, the bottom-most intrinsic layer is made from a relatively narrow band gap material and the top-most layer is made from a relatively wide band gap material. In this manner, the top-most cell will absorb only the shorter wavelength illumination and the bottom-most cell will primarily function to absorb longer. wavelength illumination.

In one typical tandem photovoltaic device the substrate 12 comprises a layer of stainless steel and the first cell 18a includes an amorphous silicon-hydrogen-germanium alloy intrinsic layer of approximately 2000 angstroms thickness interposed between relatively thin layers of N-doped 22a and P-doped 24a silicon-hydrogen alloy material. In a most preferred embodiment, the layer of P-doped material 24a is a micro-crystalline layer. In this embodiment the intermediate cell 18b includes an approximately 3000 angstrom thick intrinsic amorphous silicon-hydrogen alloy layer 20b interposed between N-doped 22b and P-doped 24b layers as previously noted. In this embodiment the topmost cell 18c is generally similar to the intermediate cell 18b except that the intrinsic layer thereof 20c is approximately 800 to 1000 angstroms in thickness.

As noted above, conventional wisdom has dictated that cell thicknesses should be optimized so as to match the currents produced thereby in order to provide optimum device performance. It has been found, in accord with the principles of the present invention, that in a tandem device, the cell producing the lowest current tends to dominate the properties of the overall device. That is to say, the contribution of a low current cell to the overall performance of the device is disproportionate compared to the contribution of the remaining cells. As noted above, cell performance will depend, to a large degree, upon the quality of the material comprising the intrinsic layer of the cell. One measure of cell performance is the fill facto of the cell. Fill factor is a device parameter recognized in the art and is determined from the characteristic current-voltage curve of the device when it is subjected to illumination. In generating a curve of this type, photogenerated voltage is measured as a function of the load applied to the cell as the load varies from a short circuit condition to an infinite load (i.e., open circuit), and a series of points are graphed from this data so as to define the characteristic curve of the device. Fill factor is a measure of deviation of the area under this curve from an ideal condition and the closer in value the fill factor is to 1.0 the more useful power is provided by the cell.

It has been found that the dual tandem device wherein the fill factor of the top cell and the fill factor of the bottom cell are of equal value, for example, a value of 10% below theoretical, the overall fill factor of the resultant tandem device will be of the same value, namely 10% less than ideal. However, if the fill factor of the upper cell is 10% less than ideal and that of the lower cell is 20% less than ideal, the overall device fill factor will be approximately 12% less than ideal if the first cell is the dominant cell and it will be approximately 18% less than ideal if the second cell is the dominant cell. Similar values hold for the converse situation wherein the upper cell is of lower quality.

The present invention represents a departure from prior art teachings regarding tandem photovoltaic devices. The prior art has taught that photocurrents from the cells of a tandem device need to be matched. The present invention recognizes that the cell producing the lowest current contributes disproportionately to the device performance; and in accord with the present invention, it is taught that overall device performance can be significantly improved, and an optimum balance between manufacturing and operational efficiency can be achieved, by fabricating the highest quality cell of a tandem voltaic device so that it is the dominant cell. Therefore, the device is fabricated so that the cell having the best material properties produces a somewhat lower photocurrent under illumination than do the remaining cells. Generally, it has been found that lower deposition rate processes result in the preparation of higher quality materials, albeit at the expense of some manufacturing efficiency. For this reason it is generally preferable that the topmost cell of the tandem device, which is the thinnest cell, is fabricated from a slowly deposited, high quality material and that it be configured to be the dominant cell.

Vacuum deposition processes, as is well known in the art, include evaporation and sputtering processes as well as glow discharge deposition processes. Glow discharge deposition processes are generally preferred for the preparation of thin film semiconductor materials, particularly Group IVA semiconductor materials. In processes of this type, as is well known in the art, an input of electromagnetic energy is employed to generate a plasma from a process gas mixture which is maintained at subatmospheric pressure. In the plasma the process gas is decomposed to create deposition species which impinge upon a substrate so as to deposit a semiconductor layer. Such techniques are disclosed, for example in U.S. Pat. No. 4,226,898 and U.S. Pat. No. 4,517,223. As detailed therein, electromagnetic energy may comprise dc energy, radio frequency energy or microwave energy, and it has been found that microwave energized deposition processes tend to be highly efficient in terms of gas utilization and deposition rates, and radio frequency energized processes, while somewhat slower, produce higher quality semiconductor deposits.

In accord with one embodiment of the invention, a tandem photovoltaic device is fabricated by a process wherein the bottom-most, relatively thick cell is fabricated in a high rate, microwave energized deposition process and the top-most, relatively thin cell is a higher quality device which is preferably deposited in a radio frequency energized process. The top cell is made somewhat thinner than dictated by conventional wisdom so that it will produce a photocurrent less than the photocurrent produced by the bottom most cell. Since the dominant top cell is relatively thin, the increase in deposition rate and/or machine size attributable to the use of a slow deposition rate process will have a minor adverse effect upon the manufacturing efficiency of the device and will be offset by the increase in operational efficiency thus obtained.

EXPERIMENTAL

A series of P-I-N type photovoltaic devices and two tandem devices were prepared in accord with the principles of the present invention. The devices were prepared upon stainless steel substrates by a radio frequency energized glow discharge deposition process.

In order to prepare a first P-I-N device, a substrate was placed in a deposition chamber which was sealed from the ambient atmosphere, and an atmosphere comprising 20 SCCM of hydrogen, 0.75 SCCM of a 1% mixture of phosphine in hydrogen and 0.65 SCCM of disilane was flowed therethrough. A pump associated with the deposition apparatus was adjusted to maintain a pressure of 1.2 torr therein. The substrate was heated to a temperature of 350° C. and the gas mixture energized with radio frequency energy of 13.56 mHz from a cathode of approximately 3.5 inches in diameter at a power of 2 watts. Deposition conditions were maintained until approximately 200 angstroms of N-doped silicon alloy material was deposited on the substrate at which time cathode power was terminated. An 800 angstrom thick intrinsic layer was then deposited atop the N-doped layer and toward that end, a deposition atmosphere of 20 SCCM of hydrogen and 0.65 SCCM disilane was flowed through the chamber at a pressure of 1.2 torr. The substrate was maintained at 225° C. and the cathode energized as before for a time sufficient to deposit an 800 angstrom thick layer of intrinsic material at a deposition rate of 2.2 angstroms per second. In the final stage, a microcrystalline, P-doped layer was deposited atop the intrinsic layer by use of an atmosphere of 95 SCCM of hydrogen, 3.25 SCCM of a 2% mixture of $BF_3$ in hydrogen and 2.5 SCCM of a 5% mixture of silane in hydrogen, which was flowed through the chamber at a pressure of 1.77 torr. The cathode was energized as before and deposition conditions maintained for 65 seconds. The thus fabricated device was provided with a transparent conductive oxide top electrode in a conventional vacuum of evaporation process.

Operational parameters of thus completed photovoltaic cell were measured under the illumination of a AM 1.5 solar spectrum. Measurements were made on the device as prepared and after 600 hours of exposure to the AM 1.5 solar spectrum. The initial efficiency of the cell was 4.97% and after photo degradation it was 4.33% The fill factor of the cell as prepared was 0.76 and after degradation it was 0.703.

A second P-I-N cell was prepared as in the previous example except that the deposition rate of the intrinsic layer was 20 angstroms per second and the thickness of the intrinsic layer was 1000 angstroms. This cell manifested an initial efficiency of 4.52% and an efficiency, after 600 hours of exposure of 3.27%. The fill factor of the freshly prepared cell was 0.70 and the fill factor of the cell after degradation was 0.575.

Two tandem photovoltaic devices were deposited on stainless steel substrates precoated with a back reflector structure comprising a layer of silver covered with a layer of electrically conductive zinc oxide. The deposition techniques were in accord with the prior experiments. Both devices included substantially identical bottom cells fabricated from a layer of substantially intrinsic amorphous silicon: germanium: hydrogen, interposed between p and n doped layers as noted previously. The intrinsic layers of the top cells of the tandem devices comprised amorphous silicon: hydrogen and were both deposited at a temperature of 300° C. The intrinsic layer of the first device (L5319) was deposited at 1.2 Å/Sec and that of a second (L5320) at 8.8 Å/Sec. The operational parameters of both devices were measured after preparation and after 163 hours of light soaking under a simulated AM 1.5 solar spectrum. The parameters are reported in table 1 below, and it is clear that the device in which the top cell is deposited at the high rate, degrades more.

TABLE I

| | Jsc (mA/cm$^2$) | Voc (Volts) | FF | $\eta$ (%) | Deg (%) |
|---|---|---|---|---|---|
| L5319 INITIAL | 10.04 | 1.59 | 0.69 | 10.94 | — |
| LIGHT-SOAKED FOR 163 HOURS | 9.92 | 1.55 | 0.65 | 9.96 | 9.0 |
| L5320 INITIAL | 9.58 | 1.60 | 0.66 | 10.11 | — |
| LIGHT-SOAKED FOR 163 HOURS | 9.24 | 1.53 | 0.57 | 8.04 | 20.5 |

It will thus be seen from the foregoing that tandem photovoltaic devices having improved efficiencies may be fabricated by controlling the geometry and material properties of the layers of the device. Specifically, the thickness of the respective intrinsic layers of the cells of the tandem device is controlled so that the cell having the best material quality is the cell producing the lowest photocurrent. This approach, while counter-intuitive, assures that the material properties of the cell fabricated from the best material will dominate the operational parameters of the tandem device. Ideally, the thinnest cell of the device will be fabricated by a low deposition rate process so as to provide superior material properties, and the thickness of the intrinsic layer of that particular cell will be made slightly lesser than needed to match the currents of the remaining cells of the device.

It will be appreciated that a variety of specific processes may be implemented in accord with this broad principles, to enable the fabrication of a variety of differently configured tandem photovoltaic devices. For example, deposition may be accomplished by microwave processes, radio frequency energized processes, dc energized processes as well as thermally energized chemical vapor deposition processes and combinations thereof, to achieve the appropriate thickness and material quality parameters. The principles of the present invention may be adapted to all tandem devices having two or more cells whether they are same gap or multiple gap devices. Thus, it will be appreciated that the foregoing drawing, discussion, description, and examples are merely meant to illustrate particular embodiments of the present invention and are not meant to be limitations upon the practice thereof. It is the following claims, including all equivalents which define the scope of the invention.

We claim:

1. In a method for the manufacture of a tandem photovoltaic device of the type comprising a stacked array of photovoltaic cells disposed in an optical and electrical series relationship, wherein said array comprises:

a substrate having a first photovoltaic cell disposed thereupon, said first cell comprising: a first layer of substantially intrinsic semiconductor material interposed between a first layer of P-doped semiconductor material and a first layer of N-doped semiconductor material, said first cell being operative, when it is incorporated in said tandem photovoltaic device and said device is subjected to illumination, to generate a first photocurrent in response to the absorption of light thereby; and a second photovoltaic cell disposed in a superposed relationship with said first photovoltaic cell, said second cell comprising a second layer of substantially intrinsic semiconductor material of a preselected thickness interposed between a second layer of P-doped semiconductor material and a second layer of N-doped semiconductor material, said second cell being operative, when it is incorporated in said tandem photovoltaic device and said device is subjected to illumination, to generate a second photocurrent in response to the absorption of the illumination thereby, wherein the improvement in the method for the fabrication of said device, comprises in combination:

selecting the thickness of the second layer of substantially intrinsic semiconductor material so that the second photocurrent is less than the first photocurrent; and preparing said first layer of substantially intrinsic semiconductor material by a first deposition process and said second layer of substantially intrinsic semiconductor material by a second deposition process, wherein the material quality of said second substantially intrinsic semiconductor material prepared by said second process is greater than the material quality of said first substantially intrinsic semiconductor layer prepared by said first deposition process.

2. A method as in claim 1, wherein the deposition rate in said first process is greater than the deposition rate in said second process.

3. A method as in claim 1, wherein said first deposition process is a microwave energized glow discharge deposition process and said second deposition process is a radio frequency energized glow discharge deposition process.

4. A method as in claim 1, where n the step of preparing said first layer of substantially intrinsic semiconductor material comprises depositing a layer of semiconductor material having a band gap which is less than the band gap of said second layer of substantially intrinsic semiconductor material.

5. A method as in claim 1, wherein said photovoltaic devioe further includes a third photovoltaic cell interposed between said first cell and said second cell, said third photovoltaic cell comprising a third layer of substantially intrinsic semiconductor material interposed between a third layer of P-doped semiconductor material and a third layer of N-doped semiconductor material, said third cell being operative, when it is incorporated in said tandem photovoltaic device and said device is subject to illumination, to generate a third photocurrent in response to the absorption of light thereby; wherein the step of selecting the thickness of said second layer of substantially intrinsic semiconductor material further comprises selecting said thickness so that the second photocurrent is less than the third photocurrent, said method further including the step of depositing said third layer of substantially intrinsic semiconductor material by a third deposition process wherein the material quality of said third layer of substantially intrinsic semiconductor material is less than the material quality of said second layer of substantially intrinsic semiconductor material.

6. A method as in claim 5, wherein the deposition rate in said third process is greater than the deposition rate in said second process.

7. A method as in claim 5, wherein the material quality of said third layer of substantially intrinsic semiconductor material is greater than the material quality of said first layer of substantially intrinsic semiconductor material.

8. A tandem photovoltaic device of the type comprising a stacked array of P-I-N photovoltaic cells disposed in an optical and electrical series relationship, said device comprising:

an electrically conductive bottom electrode;

a first P-I-N type photovoltaic cell disposed upon the bottom electrode, said first cell comprising a first layer of substantially intrinsic semiconductor material interposed between a first layer of P-doped semiconductor material and a first layer of N-doped semiconductor material, said first cell being operative, when it is incorporated in said tandem photovoltaic device and said device is subjected to illumination to generate a first photocurrent in response to the absorption of light thereby;

a second P-I-N type photovoltaic cell disposed in a superposed relationship with said first cell and in a series electrical relationship therewith, said second cell comprising a second layer of substantially intrinsic semiconductor material of a preselected thickness, interposed between a second layer of P-doped semiconductor material and a second layer of N-doped semiconductor material, said second cell being operative, when it is incorporated in said tandem device and said device is subjected to illumination, to generate a second photocurrent in response to the absorption of illumination thereby, the thickness of said first and second layers of substantially intrinsic semiconductor material being selected so that the second photocurrent is less than the first photocurrent and the material quality of the second layer of substantially intrinsic semiconductor material is greater than the material quality of the first layer of substantially intrinsic material; and a top electrode disposed in electrical communication with said second photovoltaic cell.

9. A device as in claim 8, wherein said first cell is characterized by a first fill factor, when it is operative to generate said first photocurrent and said second cell is characterized by a second fill factor when it is operative to generate said second photocurrent, said second fill factor being greater than said first fill factor.

10. A photovoltaic device as in claim 8, wherein the first layer of substantially intrinsic semiconductor material has a band gap which is less than the band gap of said second layer of substantially intrinsic semiconductor material.

11. A device as in claim 10, wherein said first layer of substantially intrinsic semiconductor material is a silicon-germanium-hydrogen based alloy and said second layer of substantially intrinsic semiconductor material is a silicon-hydrogen based alloy.

12. A device as in claim 8, further including a third P-I-N type photovoltaic device interposed between said first cell and said second cell in an electrical series relationship therewith, said third cell comprising a third layer of substantially intrinsic semiconductor material interposed between a third layer of P-doped semiconductor material and a third layer of N-doped semiconductor material, said third cell being operative, when it is incorporated in said tandem photovoltaic device and said device is subjected to illumination, to generate a third photocurrent in response to the absorption of light thereby; wherein said second photocurrent is less than said third photocurrent.

13. A device as in claim 12, wherein said first cell is characterized by a first fill-factor, when it is operative to generate said first photocurrent, said second cell is characterized by a second fill factor when it is operative to generate said second photocurrent and said third cell is characterized by a third fill factor when it is operative to generate said third photocurrent; said device further characterized in that said third fill factor is less than said second fill factor.

14. A device as in claim 13, wherein said third fill factor is greater than said first fill factor.

15. A device as in claim 8, wherein said first layer of substantially intrinsic semiconductor material and said second layer of substantially intrinsic semiconductor material each includes a Group IVA element therein.

* * * * *

UNITED STATES PATENT AND TRADEMARK OFFICE
CERTIFICATE OF CORRECTION

PATENT NO. : 5,298,086
DATED : March 29, 1994
INVENTOR(S) : Guha, Subhendu; Yang, Chi C.

It is certified that error appears in the above-indentified patent and that said Letters Patent is hereby corrected as shown below:

Column 9, line 41, delete "where n" and insert --wherein--

Signed and Sealed this

Twenty-sixth Day of July, 1994

Attest:

BRUCE LEHMAN

*Attesting Officer*    *Commissioner of Patents and Trademarks*